United States Patent [19]
Gershoni et al.

[11] Patent Number: 5,844,930
[45] Date of Patent: Dec. 1, 1998

[54] QUANTUM WIRE LASERS

[75] Inventors: David Gershoni, Tivon, Israel; Timothy Dean Harris, Toms River, N.J.; Joel Hasen, New Providence, N.J.; Loren Neil Pfeiffer, Morristown, N.J.; Kenneth William West, Mendham, N.J.

[73] Assignee: Lucent Technologies Inc., Murray Hill, N.J.

[21] Appl. No.: 748,330

[22] Filed: Nov. 13, 1996

[51] Int. Cl.$^6$ ........................................................ H01S 3/19
[52] U.S. Cl. .................................. 372/45; 372/46; 257/14
[58] Field of Search ........................... 372/45, 46; 257/14

[56] References Cited

U.S. PATENT DOCUMENTS 5,363,394  11/1994  Pfeiffer et al. ............................. 372/45

OTHER PUBLICATIONS

Kapon et al, "Quantum Wire Heterostructures for Optoelectronic Applications", Superlattices and Microstructures, vol. 12 No 4, pp. 491–499, 1992.

Arai et al, "Fabrication Technology for Long–Wavelength GaInAs(P)/InP quantum–wire lasers by wet–chemical etching and OMVPE regrowth", Optoelectronics—Devices and Technologies, vol. 8 No. 4, pp. 461–478, Dec. 1993.

*Primary Examiner*—Rodney Bovernick
*Assistant Examiner*—Yisun Song

[57] ABSTRACT

Quantum carrier confinement in a wire-like region defined by intersecting layers is significantly enhanced by various structural modifications of a conventional quantum wire device. In that way, operation of the device at room temperature and above is made feasible.

10 Claims, 4 Drawing Sheets

QUANTUM WIRE LASERS

BACKGROUND OF THE INVENTION

This invention relates to quantum wire (QWR) lasers and, more particularly, to lasers that exhibit QWR effects at and above room temperature.

In U.S. Pat. No. 5,363,394, issued to L. N. Pfeiffer, H. L. Stormer, W. H. Wegscheider and K. W. West, there is described a QWR structure that comprises intersecting quantum well layers. The intersecting layers are usually orthogonally disposed with respect to each other to form a T-shaped geometry, although the intersection angle can in practice by any angle between 5 and 90 degrees. In such a structure, quantum bound states exist with one-dimensional free carrier motion limited to the region defined by the intersecting wells. In turn, these wire-like regions are embedded in a T-shaped dielectric waveguide. In that way, an optical mode confined to the vicinity of the wire-like region can be established. Low-threshold stimulated exciton emission from the electron-hole ground-state transition in such one-dimensional quantum wires can thereby be achieved. In practice, however, as heretofore proposed, such a QWR device must be operated at extremely low temperatures (for example, in superfluid helium at a temperature of 1.7 degrees Kelvin).

Accordingly, efforts have continued by workers skilled in the art directed at trying to provide improved QWR device structures of the type described in the aforedescribed patent. In particular, these efforts have been directed at modifying such devices to attempt to make them capable of operating at or above room temperature. It was recognized that these efforts, if successful, could provide advantageous QWR lasers adapted for use in a wide variety of important practical applications.

SUMMARY OF THE INVENTION

In accordance with the principles of the present invention, quantum confinement to a T-type wire region formed by intersecting quantum wells is increased sufficiently to preserve QWR effects in the region at and above room temperature.

In accordance with one feature of the invention, quantum confinement of carriers in the wire region of a QWR device formed by intersecting quantum well layers is enhanced by introducing a particular type of localized strain in the wire region. In that way, the bandgap of the material in the wire region is in effect lowered relative to that in the remaining material of the intersecting wells.

In accordance with another feature of the invention, a QWR device formed by intersecting quantum well layers that define a wire region is structured to compensate for a crystallographic effect in one of the layers. This effect causes the confinement and distribution of hole states with respect to the wire region to be deleteriously affected. Compensation is achieved by raising the bottom of the quantum well of the one layer relative to the bottom of the quantum well of the other layer. At the same time, the width of the quantum well with the raised bottom is made sufficiently greater than that of the other quantum well to maintain the symmetry of distribution of electron states relative to the wire region. In that way, the electron-hole wavefunction overlap, and thus the exciton binding energy, in the wire region is maximized.

In accordance with yet another feature of the invention, carrier confinement is established in a wire-like region defined by two intersecting layers. At least one of the layers constitutes a quantum well layer. The other intersecting layer is sandwiched between two thin blocking barriers that in effect establish in the quantum well layer a small-lateral-dimension region characterized by an electron energy level that is less than that on either side of the region. In that way, a wire-like region adapted to achieve quantum confinement of carriers is defined by the blocking barriers at the intersection of the layers.

In further accord with the invention, QWR devices each having a wire-like region defined by intersecting layers are made in a a process based on etching rather than cleaving. Multiple substantially identical QWR devices are thereby made in a relatively low-cost batch-fabrication process.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
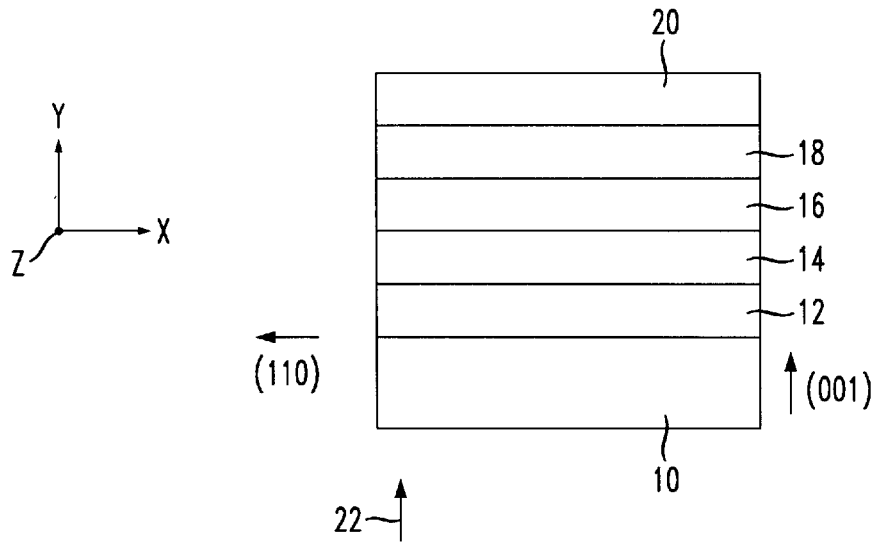
FIGS. 1 and 2 respectively show in a simplified cross-sectional way a standard QWR device structure after conventional first and second deposition sequences have been carried out.
Figure 2:
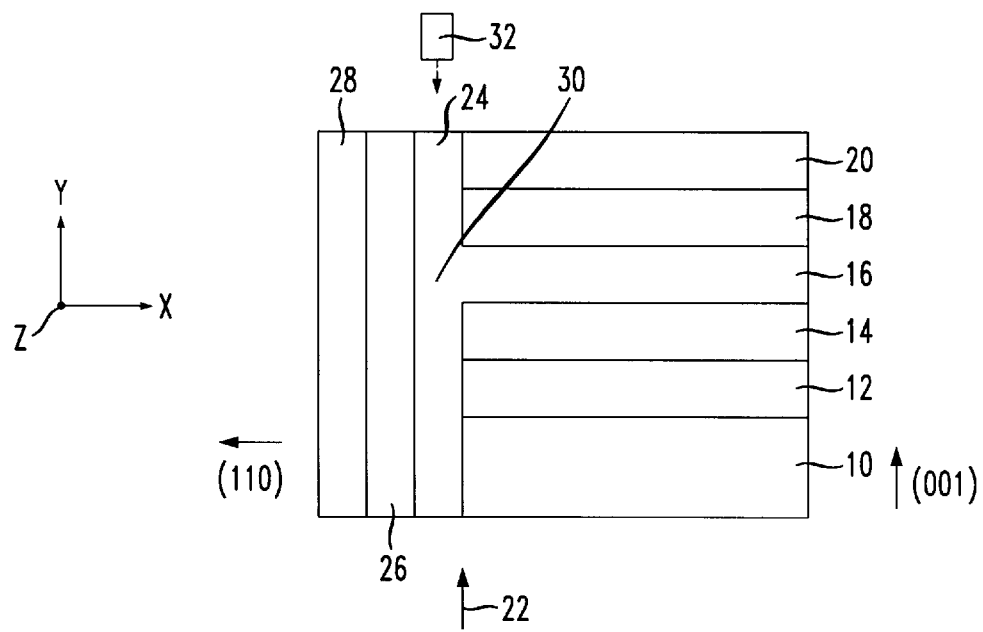

The conventional QWR device that is schematically depicted in FIGS. 1 and 2 is of the particular type described in the aforementioned patent (U.S. Pat. No. 5,363,394). As specified therein, such a device is typically made in a two-part growth sequence by standard molecular-beam-epitaxy (MBE) techniques carried out in a conventional deposition chamber.

In a first growth sequence, as represented in FIG. 1, successive layers are grown by MBE on a (001) gallium arsenide (GaAs) substrate 10 that is about 500 micrometers ($\mu$m) thick in the indicated Y direction. As shown in FIG. 1, the layers so grown on the substrate 10 include, for example, an optical waveguiding layer 12 made of aluminum gallium arsenide (illustratively, of $Al_{0.5}Ga_{0.5}As$), a barrier layer 14 made of $Al_{0.35}Ga_{0.65}As$, and a quantum well layer made of GaAs. [Alternatively, in practice, the layer 16 may comprise a conventional multiple-quantum-well (MQR) region that includes plural interleaved barrier and well layers.] Further, the structure also includes barrier and optical waveguiding layers 18 and 20 that are respectively identical or substantially identical to the layers 14 and 12.

As described in the cited patent, the substrate 10 of FIG. 1 is then thinned (for example, by lapping the bottom-side thereof to a thickness of about 150 $\mu$m) to make it easier to cleave, prepared for cleaving and then reinserted into the MBE deposition chamber. Next, in the chamber, an in-situ cleave is performed at arrow 22 (FIG. 1) along a plane that is parallel to the indicated Y–Z plane. In that way, a fresh crystallographically perfect (110) surface is exposed.

Subsequently, a second MBE growth sequence is initiated in the chamber on the clean (110) surface to form layers that are orthogonally disposed with respect to the layers deposited during the first growth sequence.

In particular, as schematically indicated in FIG. 2, layers 24, 26 and 28 are successively formed during the second growth sequence. The layer 24 comprises a quantum well (or MQW) layer, the layer 26 represents a barrier layer, and the layer 28 constitutes an optical waveguiding layer. In a standard such device structure, the quantum well layer 24 comprises, for example, GaAs, the barrier layer 26 comprises $Al_{0.35}Ga_{0.65}As$, and the optical waveguiding layer 28 comprises $Al_{0.5}Ga_{0.5}As$.

As is evident from FIG. 2, the well layers 16 and 24 intersect to form a T-shaped junction. The junction so defined constitutes a wire-like region 30 that extends in the indicated Z direction. In practice, the wire-like junction has, for example, a cross-section as small as approximately seven nanometers (nm) by seven nm. In the vicinity of the junction, the electron wavefunction can expand by spreading a short distance into each of the well arms that define the junction. In an actual device, this creates a bound state for the wire-like region that is about seventeen milli-electron Volts (meV) below that of the adjacent wells. But, since at room temperature electrons have kinetic energy of approximately twenty-five meV, it is apparent that a QWR device including such a region must be maintained well below room temperature to insure reliable operation of the structure as a quantum wire device.

As described in the aforecited patent, pumping of a QWR device of the type represented in FIG. 2 can be accomplished either optically or electrically. Illustratively, FIG. 2 shows an optical source 32 designed to supply pumping energy along the Z-direction extent of the indicated wire-like region.

Importantly, in a conventional QWR device of the type represented in FIG. 2, the various aforespecified constituent layers are deposited in a lattice-matched manner. This is purposely done to avoid introducing stain into the device structure. Heretofore, the introduction of strain into such a structure was consistently considered to be an undesirable effect which could produce serious consequences such as crystallagraphic dislocations that would deleteriously affect device performance.

In accordance with the principles of the present invention, a QWR device of the general type represented in FIG. 2 is fabricated in a manner that purposely introduces strain into its layered structure. By doing so in a selective controlled way, as described in specific detail below, carrier confinement in the wire-like region is significantly enhanced, whereby operation of the device at considerably higher temperatures than heretofore realized is achieved.

Figure 3:
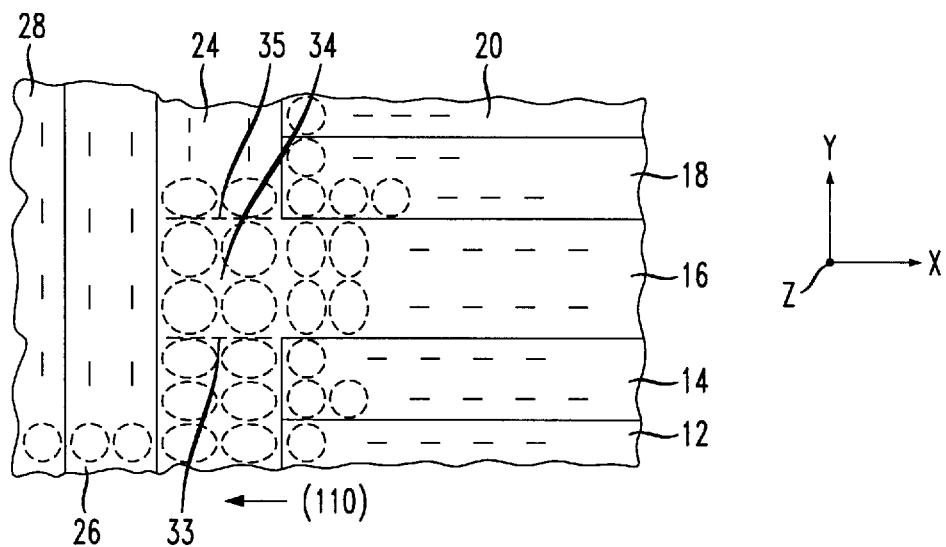
FIG. 3 schematically depicts one specific illustrative way in which the device represented in FIG. 2 is modified, in accordance with the principles of the present invention, to enhance carrier confinement in its wire region.

The introduction of strain into a FIG. 2-type device, in accordance with the present invention, is illustrated in FIG. 3. For purposes of simplicity and clarity, FIG. 3 shows only a part of such a QWR device. Except for the differences specified below, the remainder of the FIG. 3 device may be identical to the structure depicted in FIG. 2.

Thus, for example, the device of FIG. 3 is also fabricated by standard MBE techniques on a substrate made of (001) GaAs in a two-sequence growth cycle. And the optical waveguiding layer 12 of FIG. 2 made of $Al_{0.5}Ga_{0.5}As$, as well as the barrier layer 14 made of $Al_{0.35}Ga_{0.65}As$ (both of which are lattice-matched to GaAs), are also included in FIG. 3. The spherical shape of some of the constituent elements of the material of the layers 12 and 14 are symbolically represented in FIG. 3 by dash-line circles. The bond lengths or lattice constants of these constituents in the layers 12 and 14 are matched to those in the substrate. Similarly, the constituent elements of the materials of the layers 18 and 20 of FIG. 3 are also lattice-matched to those in the layers 12 and 14 and to those in the substrate.

But, in accordance with the principles of the present invention, the quantum well layer 16 of FIG. 3 is made of a material whose constituent elements have on average a lattice constant or bond length that is longer than those of the layers 14 and 18 (and thus also longer than those of the layers 12 and 20, and of the substrate).

In one particular illustrative example, the quantum well layer 16 of FIG. 3 is made of indium gallium arsenide, specifically, of $In_{0.1}Ga_{0.9}As$. The bond length or lattice constant of this material is about 0.8% more than that of the material ($Al_{0.35}Ga_{0.65}As$) out of which the adjacent layers 14 and 18 are made. Accordingly, as the larger constituents of the layer 16 are epitaxially deposited on the layer 14, the larger constituents are in effect constrained to assume approximately the same X-direction extent as the constituents of the layer 14. But, at the same time, the larger constituents of the layer 16 may in effect be regarded as being systematically deposited to assume Y-direction dimensions that are longer than those of the constituents of the layer 14. In other words, for representational purposes, the larger constituent elements of the layer 16 may be conceptualized as prolate ellipsoids having elliptical cross-sections, as depicted by dash-line ellipses in the layer 16. By contrast, the subsequently deposited epitaxial layers 18 and 20 overlying the layer 16 of FIG. 3 may be regarded as having spherically configured constituent elements that are lattice-matched to each other, to the material of the layers 12 and 14, and to the substrate.

After the layers 12, 14, 16, 18 and 20 shown in FIG. 3 are grown in a first MBE sequence, the depicted structure is cleaved and then the layers 24, 26 and 28 are grown on the cleaved surface, in a straightforward manner such as that described above in connection with FIGS. 1 and 2. In accordance with one specific feature of the present invention, however, the quantum well layer 24 is also, for example, made of a non-lattice-matched material such as $In_{0.1}Ga_{0.9}As$. In that particular illustrative case, the quantum well layers 16 and 24 are each thus made of the same material.

To assist in discussing the device structure of FIG. 3, the approximate lower and upper boundaries of the T-intersection wire region defined by the quantum well layers 16 and 24 are respectively indicated by horizontal dash lines 33 and 35. As the layer 24 is epitaxially deposited, the relatively large constituent elements thereof below the line 33 and above the line 35 may be regarded as being constrained to assume a prolate-ellipsoid shape with elliptical cross-sections whose Y-direction widths are approximately the same as the diameters of the elements in the layers 12, 14, 18 and 20 and whose X-direction heights are accordingly about the same as the Y-direction heights of the previously described elements in the layer 16. In the wire region 34 of the layer 24, however, the constituent elements of the layer 24 are in effect forced by the epitaxial constraints to assume relatively large oblate ellipsoid shapes whose cross-sectional diameter is determined by the longer diameter of the elliptical configurations in the layer 16 and in the layer 24 below the line 33 and above the line 35. In being so strained to assume relatively large volumes, the bonds of the constituent elements in the region 34 are in effect put under a negative pressure relative to the bonds in other portions of the layer 24 (and also relative to bonds in the layer 16). In turn, this causes the bandgap of the strained material in the region 34 to be less than that in the remainder of the layers 16 and 24 by an amount that is significantly more than if the region 34 were not strained. In that way, the confinement of carriers to the wire region 34 is substantially enhanced.

In practice, it has been determined that the purposeful introduction of strain, as described above, can be achieved without causing deleterious dislocations or other faults in the device structure being fabricated. More specifically, it has been found that no detectable faults are introduced into the structure if the widths (the Y-direction extent of the layer 16, and the X-direction extent of the layer 24) of quantum well layers made of $In_{0.1}Ga_{0.9}As$ are maintained in the range of approximately 5-to 20 nm. For other materials, the widths of the quantum well layers can be selected to be within ranges that avoid introducing dislocations or other harmful effects into the device structure.

Further, in the FIG. 3 device, the quantum well layer 24 need not be made of a non-lattice-matched material such as $In_{0.1}Ga_{0.9}As$. Other materials such as, for example, lattice-matched GaAs may be employed to form the layer 24. Even such a lattice-matched material used to form the quantum well layer 24 will be forced by the orientation imposed by the constituent elements in the non-lattice-matched layer 16 to have its constituent elements in the wire region 34 put under a negative pressure.

In a conventional QWR device of the type represented in FIG. 2, where, for example, the two intersecting wells are each five nm wide, known crystallographic effects cause hole states in the quantum well layer 24 [hereinafter sometimes referred to as the (110) quantum well layer] to be about ten meV lower than they are in the (100) intersecting quantum well layer 16. As a result, the probability of hole distribution in the layer 24 extends well above and below the quantum wire region of the FIG. 2 device and very little of this distribution extends into the quantum well layer 16 where hole states are about ten meV higher. Consequently, an asymmetrical distribution of holes exists in the quantum well layers defining the intersecting wire region. (Electrons, by contrast, are substantially immune to the noted crystallographic effect and are accordingly approximately symmetrically distributed with respect to the wire region.) Therefore, in a standard FIG. 2-type device, a relatively poor overlap of the electron/hole wavefunction occurs in the wire region. Accordingly, the exciton binding energy in the wire region is relatively low, which mitigates against achieving desired room-temperature operation of the device.

In accordance with another feature of the principles of the present invention, the (110) quantum well layer of a particular illustrative QWR device is made of a material that in effect raises the bottom of that layer's quantum well by about ten meV relative to that of the intersecting quantum well layer. In that way, the symmetry of the distribution of hole states in the intersecting layers is enhanced and the probability for electron and hole wavefunction overlap in the wire region of the device is thereby increased.

Figure 4:
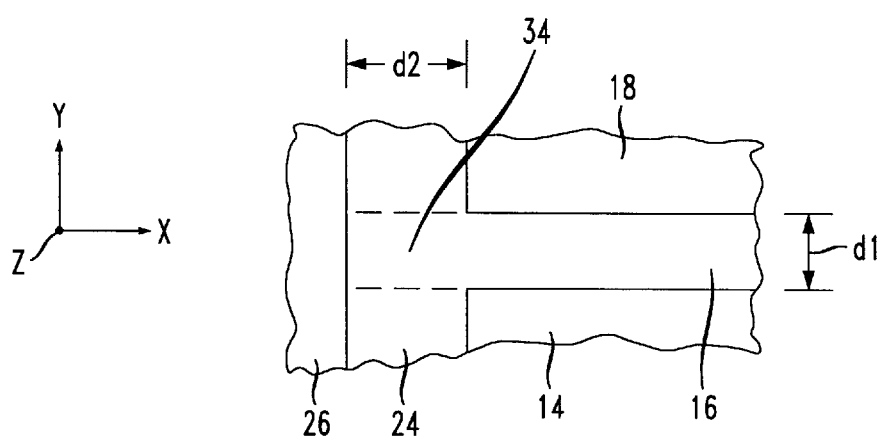
FIG. 4 shows another inventive modification of the FIG. 2 device, which is designed to improve confinement of carriers in the wire region of the device.

More specifically, as schematically represented in FIG. 4 which shows a portion of a QWR device made in accordance with the invention, intersecting quantum well layers 16 and 24 define a wire region 34 as before. By way of example, the layer 16 is made of GaAs and its adjacent barrier layers 14 and 18 are each made of $Al_{0.35}Ga_{0.65}As$. The barrier layer 26 is also made of $Al_{0.35}Ga_{0.65}As$. But, illustratively, the well layer 24 is made of a material such as $Al_{0.02}Ga_{0.98}As$ which has a larger bandgap than GaAs. In this particular case, the bottom of the quantum well of the layer 24 is thereby established at a level about ten meV above that of the layer 16. As a consequence, symmetrical distribution and confinement of holes with respect to the wire region 34 are significantly enhanced, which contributes to making it possible for the depicted QWR device to operate at and above room temperature.

But, by purposely raising the bottom of the quantum well of the (110) layer 24 of FIG. 4 relative to the bottom of the quantum well of the layer 16, the symmetry of distribution of electron states in a wire region defined by such intersecting quantum well layers is disrupted. Therefore, in further accordance with the invention, the bottom of the quantum well of the (110) layer 24 made of $Al_{0.02}Ga_{0.98}As$ is in effect lowered for electrons relative to the bottom of the quantum well of the GaAs layer 16. Advantageously, this is done in practice simply by increasing the physical width of the layer 24 relative to the width of the layer 16. The effect of such a width variance is to change the relative confinement of carriers in the intersecting well layers for electrons only. Because of their higher effective mass in both wells, the confinement of hole states is substantially unaffected by such as width variation in the two layers.

In one particular illustrative case in which the layer 16 of FIG. 4 is made of GaAs and the layer 24 thereof is made of $Al_{0.02}Ga_{0.98}As$, the width d1 of the layer 16 is designed to be about 4.8 mm and the width d2 of the layer 24 is selected to be approximately 5.8 nm. In that way, an approximately symmetrical distribution of electron states with respect to the wire region 34 is established without affecting the previously described symmetrical distribution of hole states that is achieved by choosing different specified respective materials for the layers 16 and 24. As a result, a relatively height probability of electron/hole wavefunction overlap in the wire region 34 of FIG. 4 is thereby ensured. This maximizes exciton binding energy in the region 34 and thereby establishes a basis for relatively high-temperature operation of a QWR device.

In particular illustrative QWR device described above and shown in FIG. 4, the bottom of the (110) quantum well of the layer 24 was raised relative to that of the layer 16. But, in accordance with the invention, it is also feasible in principle to select the materials of the layers 16 and 24 such that relative to a standard such device the bottom of the quantum well of the layer 16 is lowered by about ten meV relative to that of the layer 24.

In accordance with another feature of the principles of the present invention, a small-dimension wire-like region is defined in a quantum well layer by two spaced-apart so-called blocking barrier layers that are disposed to intersect the quantum well layer. A portion of a particular illustrative QWR device that embodies such a concept is schematically represented in FIG. 5.

Figure 5:
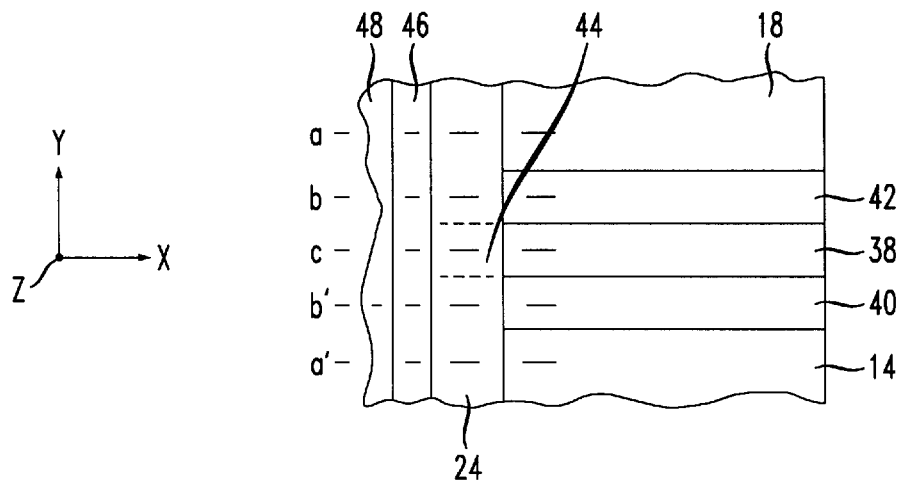
FIG. 5 illustrates yet another improvement of the FIG. 2 device.

In FIG. 5, layers 14 and 18 represent conventional barrier layers each made, for example, of $Al_{0.35}Ga_{0.65}As$. Layer 38 comprises $Al_xGa_{1-x}As$, where x has, for example, a value in the range from zero to about 0.35. And blocking barrier layers 40 and 42 each comprise, illustratively, aluminum arsenide (AlAs). By way of example, each of the layers 38, 40 and 42 has a width or Y-direction extent of about 10 nm.

For x=0, the layer 38 (FIG. 5) made of $Al_xGa_{1-x}As$ comprises simply GaAs. In that case, the layer 38 constitutes a quantum well layer, and a wire region is defined by the intersecting quantum well layer 24 which also is, for example, made of GaAs. But, in accordance with the invention, a wire-like confinement region is also defined in the layer 24 even for values of x up to 0.35 in the layer 38.

In the limiting case in which x=0.35, the layer 38 of FIG. 5 comprises $Al_{0.35}Ga_{0.65}As$ and does not constitute a quantum well layer relative to the barrier layers 14 and 18. Even in that case, however, a wire-like carrier-confinement region 44 is established in the quantum well layer 24 in a region whose extent is defined by the blocking barrier layers 40 and 42.

In FIG. 5, the wire region 44 in the quantum well layer 24 of the depicted QWR device has a Y-direction extent approximately equal to the Y-direction extent of the layer 38. The device also, for example, includes another blocking barrier layer 46 made of AlAs, and another barrier layer 48 made of $Al_{0.35}Ga_{0.65}As$.

The energy levels of electrons in different portions of the quantum well layer 24 of FIG. 5 are at various values as determined by the nature of the sandwiching material adjacent to each portion. Thus, for example, (assuming that the layer 24 is a 5nm-wide quantum well of GaAs), in the vicinity of dash reference lines a and a', where the material to the right of the layer 24 comprises $Al_{0.35}Ga_{0.65}As$ and the material to the left thereof comprises AlAs, the energy level of electrons in those vicinities has an eigenvalue of 109 meV. By contrast, at b and b', where the material to the right of the layer 24 comprises AlAs and the material to the left thereof also comprises AlAs, the energy level of electrons in those vicinities has an eigenvalue of 134 meV. In the vicinity of reference line c, where the material to the left of the layer 24 comprises AlAs and the material to the right thereof (the material of the layer 38) comprises, for x=0.35, $Al_{0.35}Ga_{0.65}As$, the energy level of electrons in the region 44 has an eigenvalue of 109 meV. In that case, the bound state for electrons in the region 44 is twenty-five meV below that of adjacent upper and lower regions of the quantum well layer 24. Accordingly, carrier confinement is achieved in the wire-like region 44 even in the case where the layer 38 does not constitute a quantum well layer.

For smaller values of x for the material of the layer 38 of FIG. 5, the bound state for electrons in the region 44 is further enhanced. Thus, for example, for x=0.05, the energy level of electrons in the vicinity of reference line c has an eigenvalue of fifty meV. In that case, the bound state for electrons in the wire-like region 44 is eighty-four meV below that of adjacent upper and lower regions of the quantum well layer 24. A basis is thereby provided for reliable operation of a QWR device at room and higher temperatures.

Thus, in accordance with the inventive principles described herein, a conventional QWR device of the type represented by FIG. 2 can be modified to enable operation thereof at or above room temperature (for example, up to about 100 degrees Celsius). In particular, such advantageous operation is achieved by incorporating in the FIG. 2 device one or more of the structural techniques respectively embodied in FIGS. 3 through 5 and described in detail above.

It has been assumed that all the QWR devices described herein were made by a fabrication sequence that included a cleaving step, as specified earlier above. In some cases, however, it is advantageous to omit the cleaving step and to substitute therefor an etching procedure. In that way, a method well suited to batch-fabrication of multiple low-cost QWR devices is made possible. The essence of such an etching procedure is described below in connection with FIGS. 6 through 8.

Figure 6:
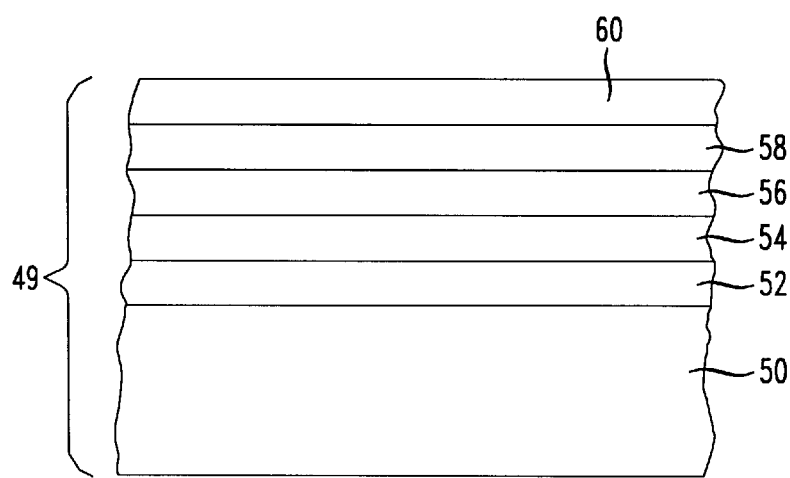
FIGS. 6 through 8 schematically illustrate an advantageous etching technique in accordance with which the QWR devices represented in FIGS. 3 through 5 may be fabricated.

FIG. 6 schematically represents a portion of a wafer 49 on which multiple QWR devices of the general type described earlier herein are to be defined. Illustratively, the wafer 49 comprises a substrate 50, an optical waveguiding layer 52, a barrier layer 54, a quantum well layer 56, a barrier layer 58, and an optical waveguiding layer 60. By, for example, clean dry etching techniques, multiple identical grooves are simultaneously formed in the surface of the depicted wafer. One such etched groove 61 is indicated in FIG. 7.

Figure 7:
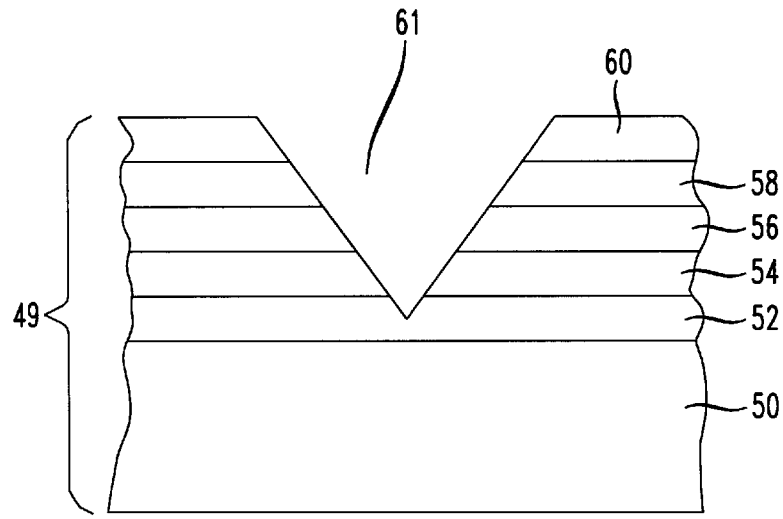
Figure 8:
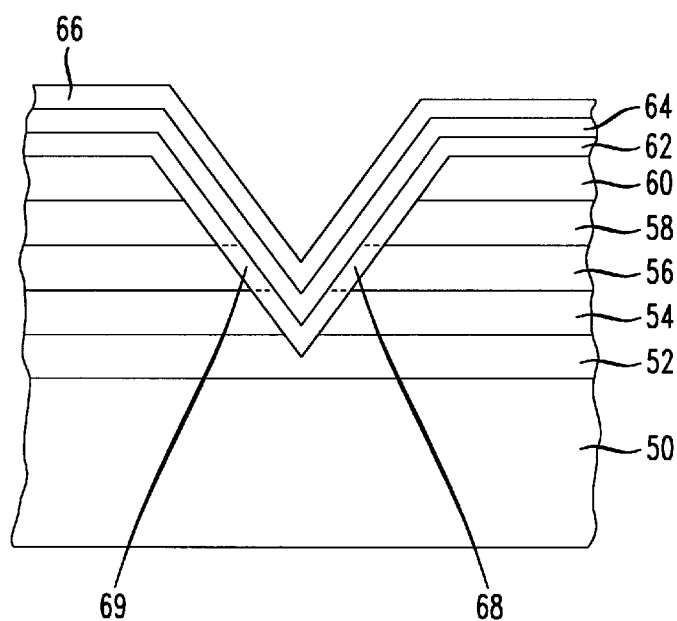

As depicted in FIG. 8, a quantum well layer 62 is then deposited on the top surface of the grooved wafer of FIG. 7. Subsequently, a barrier layer 64 and then an optical waveguiding layer 66 are deposited on top of the layer 62. Regions 68 and 69 defined by the intersections of the quantum well layers 56 and 62 constitute wire-like regions in which carrier confinement occurs. (Dash lines indicate the approximate upper and lower extents of the wire-like regions 68 and 69). Multiple QWR devices can thereby be simultaneously made in the wafer 49.

It is feasible to apply one or more of the inventive techniques described above and illustratively embodied in the cleaved device structures of FIGS. 3 through 5 to an etched structure of the type represented in FIG. 8. Thus, for example, if the quantum well layer 62 of FIG. 8 should be deposited on a (110) crystal face, the particular technique embodied in FIG. 4 is usefully applied to FIG. 8 to enhance the electron/hole wavefunction overlap in the wire-like regions 68 and 69. Moreover, the strain technique embodied in FIG. 3 and the blocking barrier layers shown in FIG. 5 are also easily capable of being applied to the device structure of FIG. 8 to further enhance carrier confinement in the regions 68 and 69.

Finally, it is to be understood that the above-described arrangements and techniques are only illustrative of the principles of the present invention. In accordance with these principles, numerous modifications and alternatives may be devised by those skilled in the art without departing from the spirit and scope of the invention.

What is claimed is:

1. A quantum wire device comprising means including first and second intersecting layers for defining a quantum wire region at the intersection of said layers, means disposed about said layers for index guiding any emitted radiation to confine it to the vicinity of said wire region, and means for enhancing electronic carrier confinement in said quantum wire region, wherein said means for enhancing electronic carrier confinement comprises means for introducing a strain in at least one of said first and second intersecting layers thereby to sufficiently lower the bandgap of the wire region defined at said intersection relative to the bandgap of said first and second intersecting layers to enable operation of said device at and above room temperature.

2. A device as in claim 1 further including a substrate, and wherein said first intersecting layer comprises a quantum well layer that is sandwiched between barrier layers, said first intersecting layer and said barrier layers overlying said substrate.

3. A device as in claim 2 wherein said quantum well layer is made of a material that is non-lattice-matched to the material out of which said substrate is made.

4. A device as in claim 3 wherein said second intersecting layer also comprises a quantum well layer.

5. A device as in claim 4 wherein said second intersecting layer is lattice-matched to said substrate.

6. A device as in claim 4 wherein said second intersecting layer is non-lattice-matched to said substrate.

7. A device as in claim 1 further including a substrate, and wherein said first intersecting layer is sandwiched between blocking barrier layers that also intersect said second layer, said first layer and said blocking barrier layers overlying said substrate.

8. A device as in claim 7 wherein said blocking barrier layers define in said second layer a wire-like region whose extent is approximately the same as the extent of said first intersecting layer between said blocking barrier layers.

9. A device as in claim 8 wherein said first intersecting layer sandwiched between the blocking barrier layers comprises $Al_{0.35}Ga_{0.65}As$, each of said blocking barrier layers comprises AlAs, and said second intersecting layer comprises GaAs.

10. A quantum wire device comprising means including first and second intersecting layers for defining a quantum wire region at the intersection of said layers, means disposed about said layers for index guiding any emitted radiation to confine it to the vicinity of said wire region, and means for enhancing electronic carrier confinement in said quantum wire region, wherein said means for enhancing electronic carrier confinement comprises means for introducing strain in said wire region to sufficiently lower the bandgap in said wire region relative to the bandgap in the layers defining said wire region to enable operation of said device at and above room temperature.

* * * * *